(12) United States Patent
Carullo et al.

(10) Patent No.: US 6,963,495 B1
(45) Date of Patent: Nov. 8, 2005

(54) EMI SHIELDED CHASSIS FOR ELECTRICAL CIRCUITRY

(75) Inventors: Thomas J. Carullo, Marlton, NJ (US); Arthur G. Willers, Delran, NJ (US); Ryan K. Goodenough, Marlton, NJ (US)

(73) Assignee: Computer Network Technology Corporation, Minneapolis, MN (US)

( * ) Notice: Subject to any disclaimer, the term of this patent is extended or adjusted under 35 U.S.C. 154(b) by 0 days.

(21) Appl. No.: 10/873,373

(22) Filed: Jun. 21, 2004

(51) Int. Cl.[7] .............................................. H05K 9/00

(52) U.S. Cl. ...................... 361/818; 361/212; 361/220; 361/753; 361/799; 361/816; 174/51; 174/52.1

(58) Field of Search ................................. 361/212, 220, 361/752, 753, 796, 799, 800, 816, 818; 174/50, 174/51, 52.1, 35 R, 35 GC; 211/41.17; 312/223.2

(56) References Cited

U.S. PATENT DOCUMENTS

| 4,752,861 | A | * | 6/1988 | Niggl et al. ................. 361/692 |
| 6,570,085 | B1 | * | 5/2003 | Gabower ................ 174/35 MS |
| 6,671,160 | B2 | * | 12/2003 | Hayden ....................... 361/212 |

* cited by examiner

*Primary Examiner*—Phuong T. Vu
(74) *Attorney, Agent, or Firm*—Beck & Tysver, P.L.L.C.

(57) ABSTRACT

An enclosure for computer-based telephone switching equipment that suppresses the radiation of electromagnetic interference through the use of multiple overlapping seals and apertures.

5 Claims, 7 Drawing Sheets

EMI SHIELDED CHASSIS FOR ELECTRICAL CIRCUITRY

FIELD OF THE INVENTION

The present invention relates generally to electromagnetically shielded plastic chassis enclosures for use with electronic equipment such as a telecommunication switch.

BACKGROUND OF THE INVENTION

Modern digital circuitry operates at very high clock speeds to process data and other signals. The rapid rise times which characterize modern digital equipment gives rise to a substantial amount of broadband radio frequency radiation. If this noise is allowed to exit the chassis enclosure or cabinetry it will cause electromagnetic interference (EMI) with other nearby electrical equipment. In general, modern digital equipment is designed to comply with EMI radiation specifications that have been adopted by industry to ensure reliable operation of digital equipment. Although a complete Faraday type enclosure is the most desirable form of electromagnetic shielding for an enclosure, practical devices require both input and output ports to interact with their environment as well as cables associated with power and the like. Accommodating these "EMI holes" represents a continuing challenge for enclosure designers.

In the prior art, the most common enclosure strategy is to fabricate the cabinetry from sheet metal. Typically, metal panels are stamped and bent into appropriate shapes and can be assembled by welding or assembled by other mechanical means. The metallic panels are electrically conductive and can form a complete conductive enclosure that sometimes is welded together, a process that melts and fuses the panels and results in excellent electrical connections between the enclosure panels. Other methods of assembly may utilize rivets, screws and nuts, that employ conductive gasketing between the sheet metal joints. All these attributes along with the ductility of metal allows the formation of an enclosure that can contain higher levels of emanations.

In addition, when the chassis enclosure is open for maintenance, portions of the digital circuitry within the enclosure are not reliably grounded. In this state electronic components can be damaged by electrostatic discharge (ESD). In the prior art metal chassis, several receptacle connections are provided. These connections are used for coupling grounding straps or other ESD suppression devices to the service personnel. Attaching these "receptacles" to the conventional grounded metal enclosure in the prior art is relatively straightforward. However, if not appropriately managed exterior metal components, such as ESD connectors and lift handles, present special EMI problems. These components can form antennas for radiating EMI if not properly and reliably grounded.

In spite of the advantages of conventional metal enclosure solutions there is a continuing need to improve the EMI shielding of electronic equipment and there is a continuing desire to build new and useful enclosures that suppress radiation while permitting enclosure, operation and servicing of modern digital communication and computing systems.

SUMMARY OF THE INVENTION

The present chassis enclosure exhibits a design, architecture and fabrication methodology which allows for the suppression of electromagnetic interference (EMI) in a product which is relatively inexpensive to build and easily serviced in the field. When "opened" for servicing the enclosure has adequate ESD protection to permit easy access of the componentry and the overall enclosures is durable in its operating environment.

The width of the chassis enclosure conforms to a legacy telephone relay rack dimension widely adopted by industry, ref—Electronic Industries Association Std EIA-310-E and Military Standard #Mil-Std-189. The height and depth of the chassis enclosure are selected to be sufficient to enclose multiple plug-in circuit boards or modules that are used to form a digital switch or other computer based product. In this embodiment the substantially rectilinear enclosure is split along a vertical axis providing two separate and distinct sections. A midplane connection board is placed at the junction of the front section and the back section. The midplane provides a midline interconnection between the front and the back of the chassis enclosure, but does not represent a equal distance between the front and rear sections, this may vary depending on system requirements. The partitioning of the enclosure in a vertical plane allows the module cards in the front and back sections to meet at the midplane and to make plug connections with appropriate sockets mounted on the midplane interconnection board.

In the preferred embodiment both the halves of the enclosure are made up from individual panels that are injection molded from a polymer resin. Injection molding permits repeatable close dimensional control over all of the features and mechanical attributes of the cabinet. This improves the ability to control the dimensional tolerance of apertures and facilitates EMI shielding. The enclosure is nominally insulative and it is coated through both electroless copper and electroless nickel processes to provide a thin electrically conductive coat over all of the surfaces of the enclosure. No effort is made at masking off areas or zones of the enclosure.

The panels interconnect and can mate with mechanical interlocking features that are molded into the plastic panels. The electrical connection between these panels is enhanced with an adhesive that itself may be conductive. With all of the seams and gaps sealed the exterior of the chassis enclosure may be painted with a decorative paint. Optionally the exterior of the enclosure can be coated with a durable paint that protects the integrity of the electrical layers but which is electrically conductive.

Alignment features forming male prongs and female receptors permit the cabinetry to be aligned along the midplane and reassembled, this is a repeatable feature that enhances serviceability. A gasket seals this midline connection to suppress EMI. Captured screws, small in number, are used to close the cabinet and to compress an EMI gasket between the front and back sections of the enclosure. Opened ESD grounding receptacles are readily available on both the rear section and front section of the enclosure for use by service personal.

BRIEF DESCRIPTION OF THE DRAWINGS

Throughout the figures like reference numerals indicate identical structure, in some figures a single numeral is used several times to show the same aspect in multiple settings, wherein.

DETAILED DESCRIPTION

Figure 1:
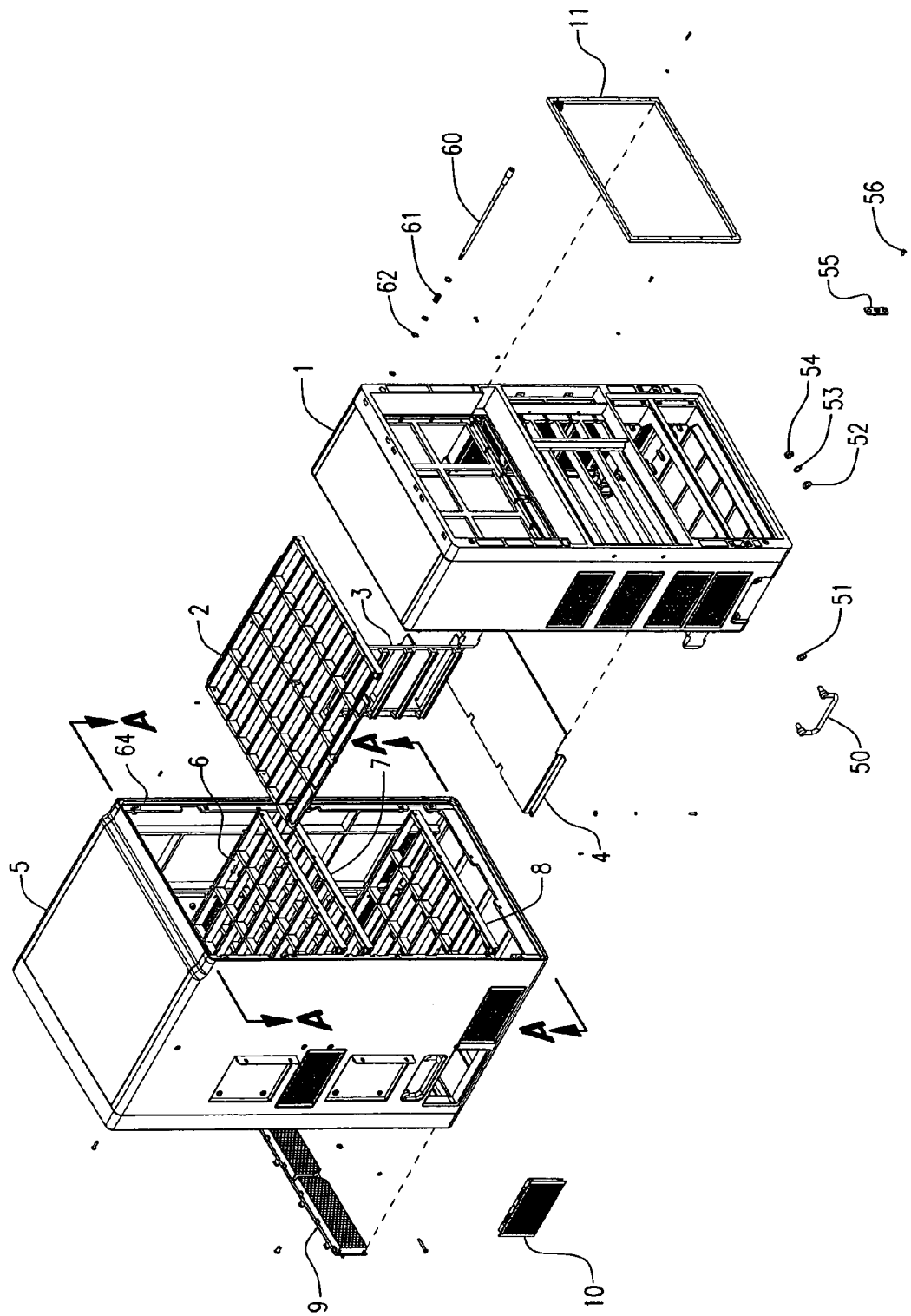
FIG. 1 is a perspective view of the chassis enclosure showing attached subcomponents.

FIG. 1 is a perspective view of the overall enclosure seen from above. The drawing shows the front section 5 and the rear section 1, as well as related attached components. These components form many of the supporting structures attaching "replaceable" components, for example the front PCB edge slot cage panel 2 can be inserted into the front section 5 and positioned as depicted by PCB edge slot cage panel 6. Complementary edge slot cage panels such as panel 7 and panel 8 cooperate to retain and position vertically oriented "replaceable" printed circuit board (PCB) modules in the front section 5. In a similar fashion sets of edge card panels typified by panel 3 can be placed into the rear section 1 to retain and position horizontally orientated "replaceable" PCB modules. A midplane not shown for clarity is positioned where the front section 5 and rear section 1 mate along the plane A-A, FIG. 1, forming a complete chassis enclosure assembly. A small number (for example 4) of captive screws are used to mate and retain the front section 5 and rear section 1. An illustrative through bolt 60 can be biased in a retracted position by spring 61. The circlip 62 and complementary groove in the bolt 60 retain the through bolt 60 in the rear section 1. This disclosure in not limited, any number of attachment features may be used. The treads on the bolt engage and mate with a captive nut in the front section 5 and when engaged they permit compression of an EMI gasket carried on the periphery of the opening 64 in the front section 5, allowing complete EMI containment between the two halves 1,5.

In FIG. 1 a lift handle 50 is shown along with mounting hardware 51–54. In the overall architecture a strong preference is made to exclude through holes in the enclosure. The handles are mounted in through holes with the through holes plated through and the attachment hardware extending from the exterior to the interior. In this application the handle has a threaded member which is attached with washers and nuts to create a gapless and electrically connected coupling with the conductive enclosure panel.

One of two representative rear ESD receptacles is labeled 55 in FIG. 1 and it is shown with related attachment hardware. The ESD receptacle is attached to a mounting plate and in turn is attached to a conductive panel of the enclosure using hardware 56 and captive nuts have been installed in the conductive panel.

Also seen in FIG. 1 is an air flow control panel 4 carried in the rear section 1 and a plurality of air vent panels typified by air vent panel 9 and air vent panel 10. These air vent panels are used to allow air to enter the enclosure while maintaining EMI emission containment.

Figure 2:
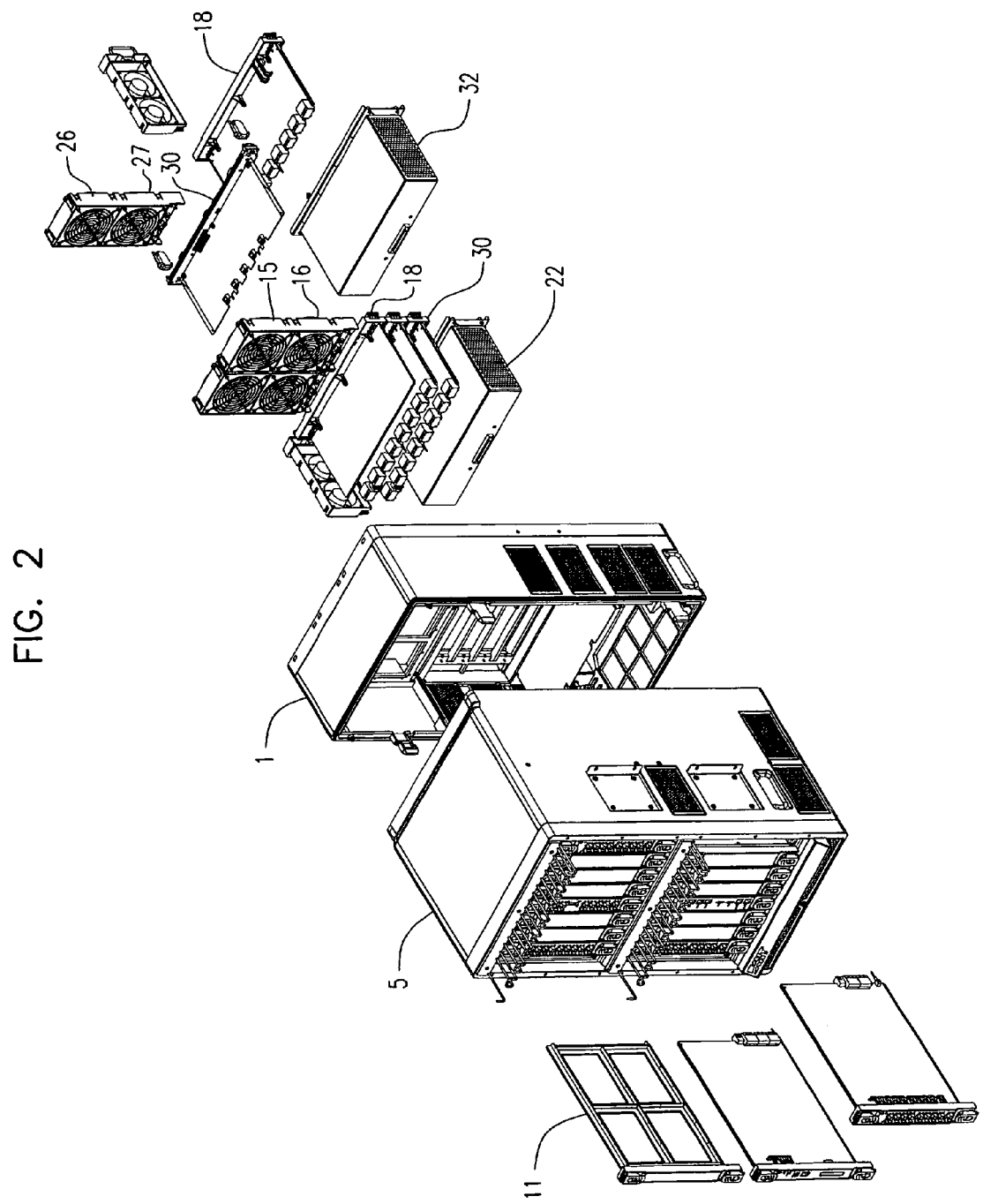
FIG. 2 is a perspective view of the chassis enclosure showing replaceable subcomponents.

FIG. 2 is a perspective view of the overall enclosure seen from above. The drawing shows the front section 5 and the rear section 1, as well as related "replaceable" components. A pair of power supplies 22 and 32 can be inserted into the rear section 1 though appropriate openings (not labeled).

Fan power and status cards typified by fan card 30 can be plugged into the midplane by insertion into opening in the exterior wall of the rear section 1. This permits the dual fan modules typified by fan 26–27 to be plugged into the chassis enclosure. EMI suppression for the fan modules is achieved by a conventional aluminum honeycomb panel 11 seen in FIG. 1 that is permanently attached to the interior of the rear section 1. All these "replaceable" components are designed to be repeatability EMI sealed against the enclosure 1,5, thus maintaining the Faraday cage.

Figure 3:
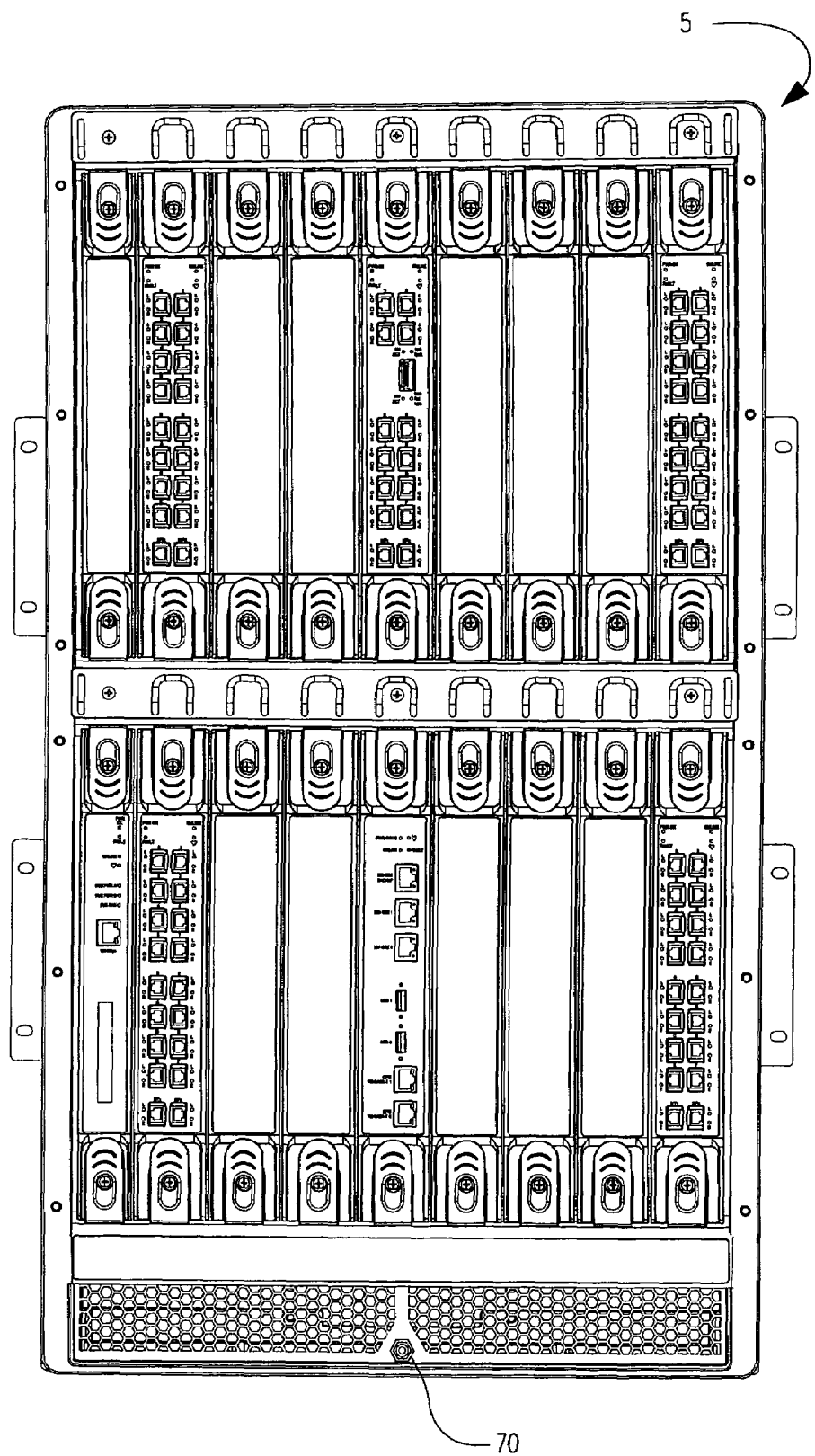
FIG. 3 is a view of the exterior face of the front section.

FIG. 3 shows the face of the front section 5 showing the front ESD receptacle 70.

Figure 4:
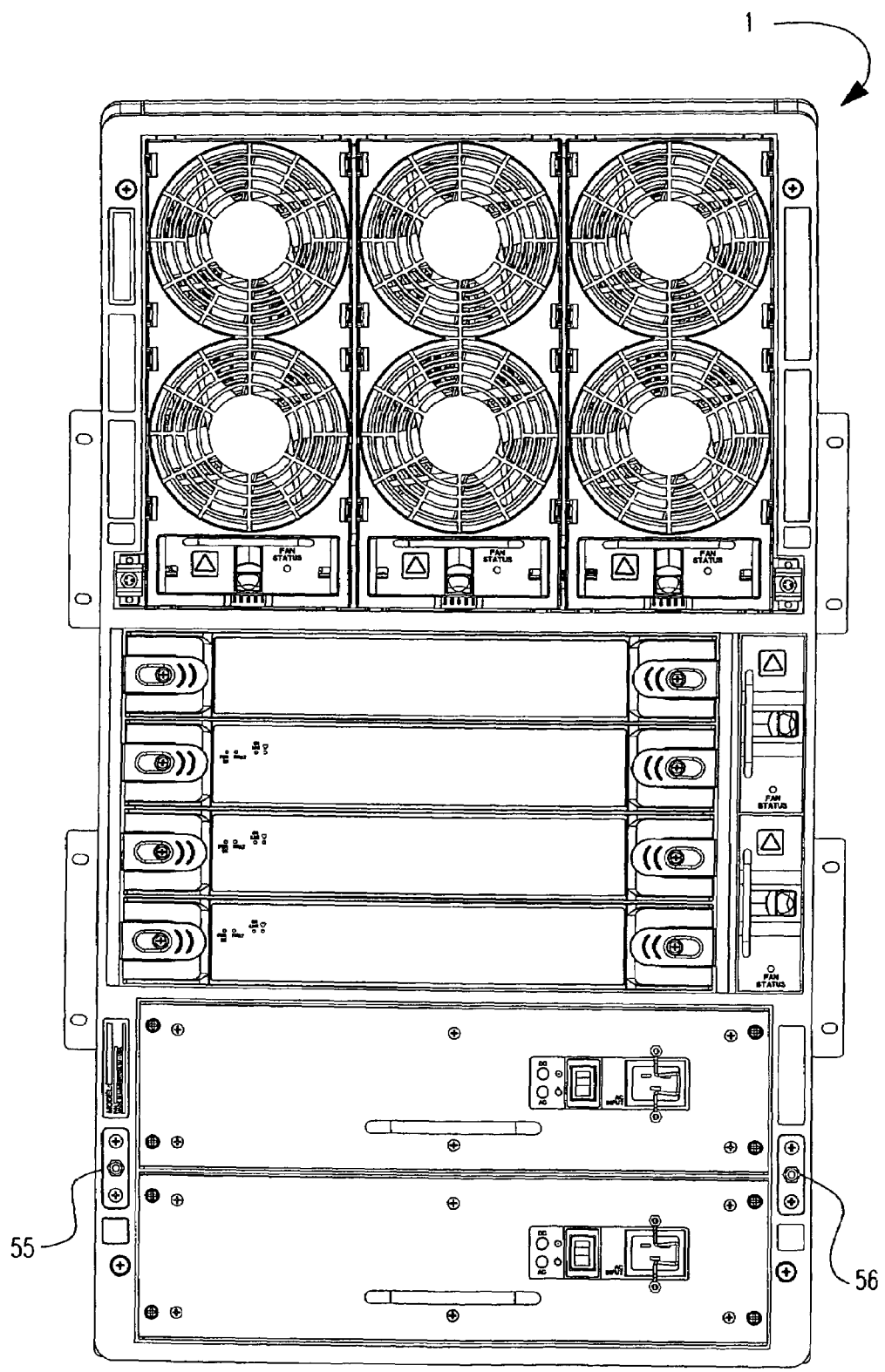
FIG. 4 is a view of the exterior face of the rear section.

FIG. 4 shows the face of the rear section 1 showing rear ESD receptacle 55 and rear ESD receptacle 56.

Figure 5:
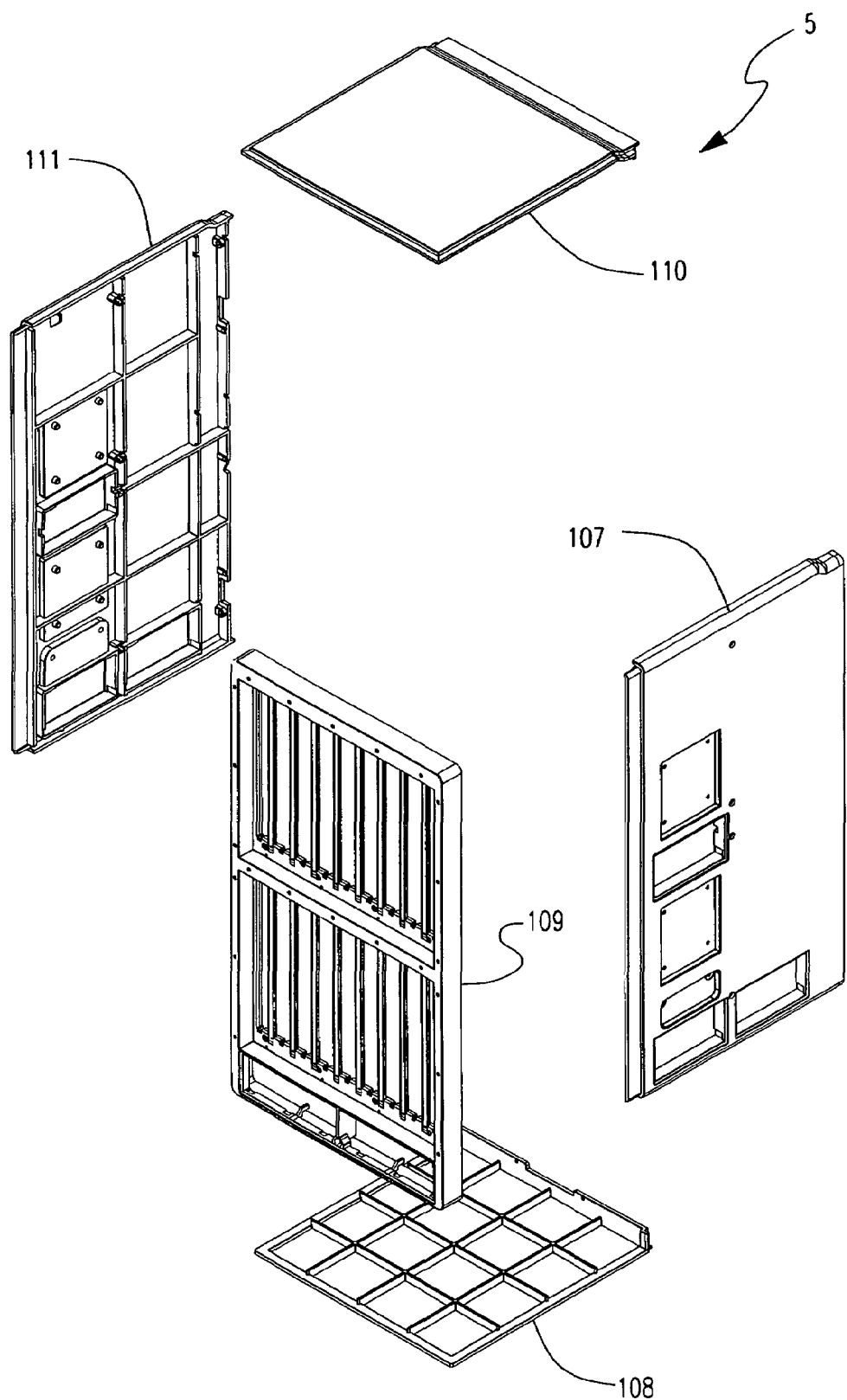
FIG. 5 is an exploded view of the front section.

FIG. 5 shows an exploded view of the front section 5 of the chassis enclosure. The front section may be made from five interlocking chassis panels including face panel 109, bottom panel 108 and side panels 107 and 111. A complementary construction is adopted for the front section 5. This enclosure half may be made from a single entity, and provide equal EMI containment.

Figure 6:
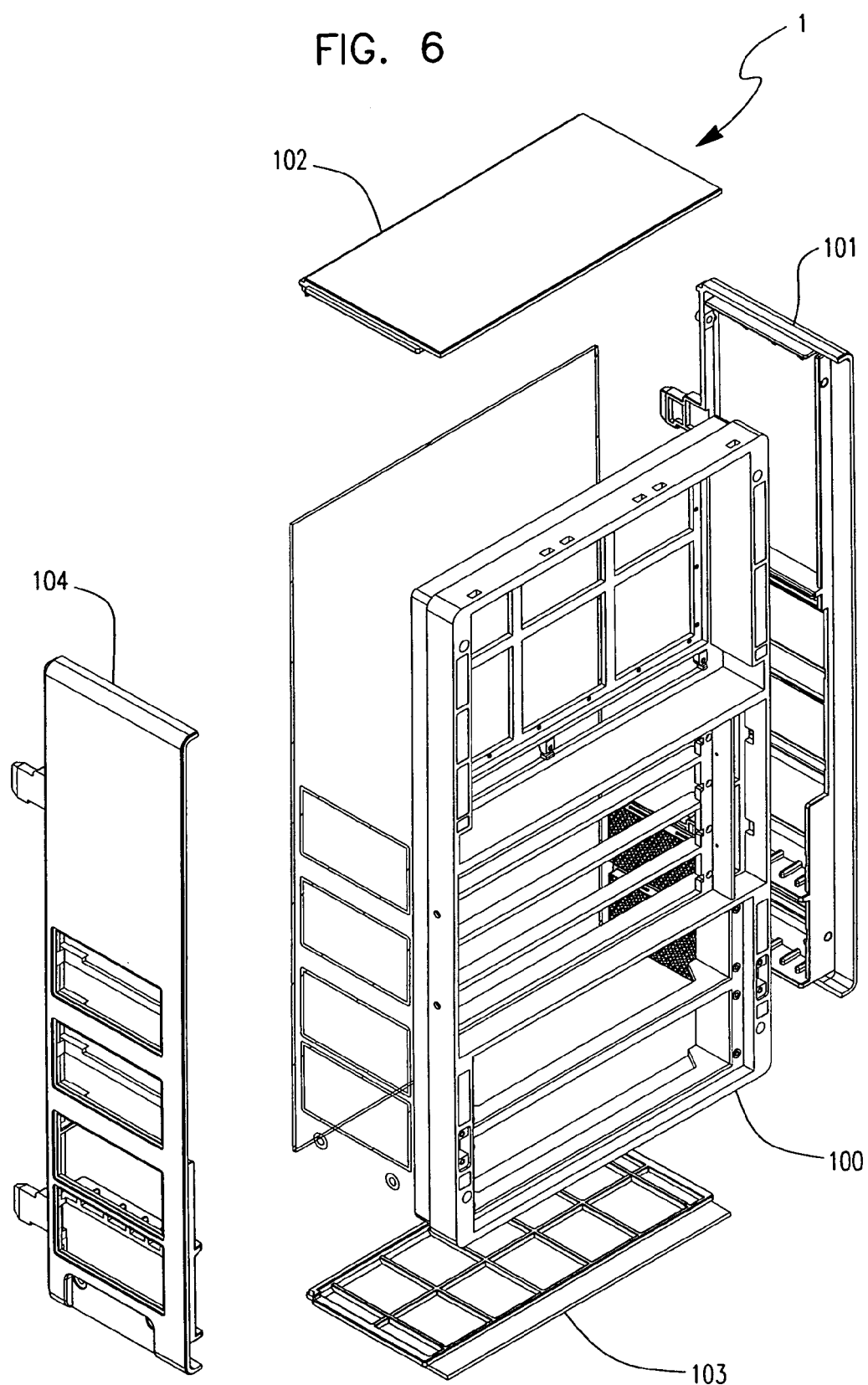
FIG. 6 is an exploded view of the rear section; and,
FIG. 7 is a cross section of a representative panel joint.

FIG. 6 shows an exploded view of the rear section 1 of the chassis enclosure. The rear section 1 is made from five interlocking chassis panels including face panel 100, top panel 102, bottom panel 103 and side panels 104 and 101. This enclosure half may be made from a single entity, and provide equal EMI containment.

Each chassis panel is injection molded from a polymer resin. The preferred plastic is a combination of a commercially available styrene resin (ABS) and a polycarbonate resin (PC), but is not limited to this type of plastic. The PC/ABS material is very strong and may be recycled in compliance with European regulations (Waste Electrical and Electronic Equipment (WEEE), European Union Directive #2002/96/EC). After deflashing from the (mould is a British term for molding) Mold, the chassis panel parts are plated in an electroless bath with a copper coating. Next the chassis panels are electroless plated with a nickel alloy. The plating is uniform and every effort is made to achieve complete coverage. However scratches and defects will not leak EMI because the injection molded plastic with the metal coatings form a single wall double coat construction which results in no line of sight aperture for RF leakage or radiation. The panels are next cleaned and then assembled. The assembled panels interlock and form a self-supporting structure.

Figure 7:
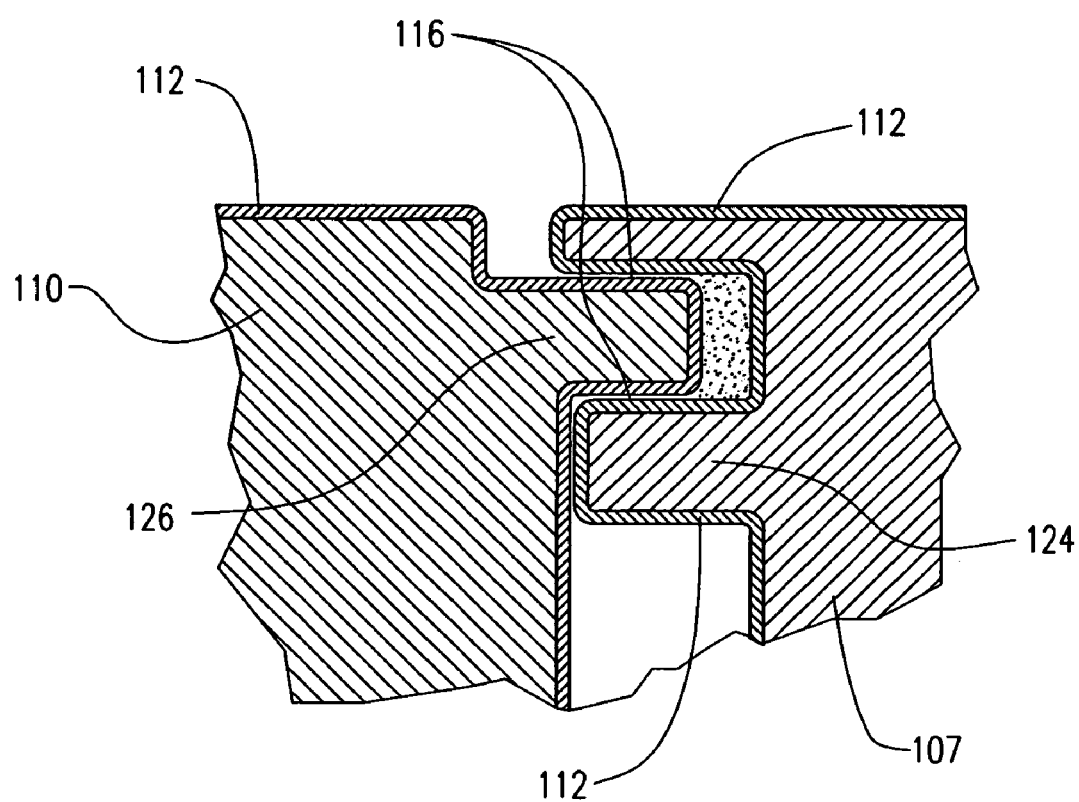

FIG. 7 is a cross section of a representative lap joint between two panels. For example the connection between side panel 107 and top panel 110 is shown in the figure. The thin metal coating is exaggerated in the figure for clarity and it is shown as coating 112 marked several times in the figure. At the lap joints 116 the metal coating on the two pieces overlap over a considerable distance. Although there is on average some clearance between the two panels the length of the overlap and the intimate connection between the metal layers makes are relatively RF leak free seam. To hold the panels together an adhesive gap D is provided that is formed by the rib feature 124 abutting the rib feature 126. The adhesive permanently bonds the panels in to the completed sections. The interlock and seam gap structures form a good but not perfect electrical connection between the panels. An additional adhesive type material is injected along the seam gap E between panels and this may be optimally loaded with silver particulate of or other conductive materials. Next the sections are painted with a conductive paint that occludes and covers scratches and other minor defects. This results in a Faraday cage within a Faraday cage construction which minimizes the radiation of EMI. An additional decorative Paint is applied to protect and beautify the exterior of the Enclosures.

We claim:
1. A chassis enclosure comprising:
    a) a rectangular box separated into a first section and a second section meeting at a vertical separation plane, each section having five panels, each panel formed of plastic and having a continuous and complete electrically conductive coating;
b) means for connecting the first section with the second section along the vertical separation plane to interlock the sections and close the rectangular box; and
c) an electrostatic discharge receptacle located in one of the panels on the outside of the first section, said electrostatic discharge receptacle comprising:
   i) a blind hole in said panel having a captive nut pressed into the plastic and contacting said conductive coating, said blind hole not penetrating the inside surface of the box;
   ii) an attachment screw; and
   iii) an electrostatic discharge receptacle plate with an electrostatic discharge receptacle coupled by said attachment screw to said captive nut, thereby electrically connecting said receptacle to said section.

2. The chassis enclosure of claim 1, wherein each section holds one or more modular cards containing electronics, and the first section contains a board located proximate to and parallel to the vertical separation plane whereby cards found in the first section connect electrically to cards found in the second section.

3. The chassis enclosure of claim 1, wherein each section holds one or more modular cards containing electronics, and the second section contains a board located proximate to and parallel to the vertical separation plane whereby cards found in the first section connect electrically to cards found in the second section.

4. The chassis enclosure of claim 1, wherein the panels are rigidly formed by injection molding of polymer plastic.

5. The chassis of any one of claims 1, 2, 3, or 4 wherein adjacent panels within a section are joined by adhesive at complementary tongue and groove joints, wherein both the tongue and the groove portions of each joint have continuous and complete electrically conductive coating, and form a self-supporting section.

* * * * *